United States Patent
Yi

[19]

[11] Patent Number: 6,154,682
[45] Date of Patent: Nov. 28, 2000

[54] SELF-CHECKING CIRCUIT IN MICROWAVE EQUIPMENT

[75] Inventor: Jae Kyoon Yi, Seoul, Rep. of Korea

[73] Assignee: LG Information & Communications, Ltd., Seoul, Rep. of Korea

[21] Appl. No.: 09/119,643

[22] Filed: Jul. 21, 1998

[30] Foreign Application Priority Data

Jul. 23, 1997 [KR] Rep. of Korea ................. 97-34514

[51] Int. Cl.[7] .................................................. G01S 3/02
[52] U.S. Cl. ................................ 700/79; 324/76.14
[58] Field of Search .................... 700/2, 79, 80, 700/299, 211, 47, 81; 257/728; 324/76.14

[56] References Cited

U.S. PATENT DOCUMENTS

| | | | |
|---|---|---|---|
| 4,780,685 | 10/1988 | Ferguson | 330/124 |
| 5,367,533 | 11/1994 | Schilling | 375/1 |
| 5,396,180 | 3/1995 | Hampton et al. | 324/551 |
| 5,521,360 | 5/1996 | Johnson et al. | 219/709 |
| 5,956,627 | 9/1999 | Goos | 455/127 |

*Primary Examiner*—Thomas C. Lee
*Assistant Examiner*—Nitin Patel

*Attorney, Agent, or Firm*—Fleshner & Kim, LLP

[57] ABSTRACT

A self-checking circuit in a microwave equipment comprising: directional couplers each for separating and extracting a portion of a microwave signal from each monitoring point on a microwave main signal path; detectors each for detecting an extracted signal from the directional coupler; multiple temperature measuring means each for measuring temperature of the detector; multiple amplifying means each for amplifying a detected signal from the detector; multiple analog/digital converting means each for converting an output signal of the amplifying means into digital data; an interface for performing interface with an outside with respect to the signal of the temperature measuring means and the digital data of the analog/digital converting means; first storage means for storing signal values transmitted through the interface; second storage means for storing a control program and various data; a central processing circuit for comparing and analyzing the signals stored in the first storage means using the control program and data stored in the second storage means and outputting a result of the comparison and analysis; and means for displaying an output signal of the central processing circuit.

19 Claims, 5 Drawing Sheets

SELF-CHECKING CIRCUIT IN MICROWAVE EQUIPMENT

BACKGROUND OF THE INVENTION

1. Field of the Invention

The present invention relates to a self-checking circuit for accurately detecting a component having an error in a microwave equipment and, more particularly, to a self-checking circuit for accurately measuring electric power of a relevant microwave equipment by compensating for characteristics of each detector changing according to temperature and displaying degrees of the electric power of microwave signals allowing close observance in the microwave equipment, thereby making it easy to check, maintain, and repair the system.

2. Discussion of Related Art

Generally, a microwave equipment uses a wave guide and coaxial line as a signal transmission line. The wave guide is disturbed in its function by change in its form caused by shock from outside or introduction of foreign substances or by change in environment such as pressure and temperature. For the coaxial line, the function may not be done well due to superannuation or breaking of a wire. These may influence other components which are normally operating. In this case, it is difficult to determine with the naked eye what components lose their functions in the overall circuit, so periodical check using a function measuring equipment is needed. Therefore, checking circuits should be installed at every important monitoring point on a signal transmission path of the microwave equipment to check whether each component operates in normal in the system.

FIG. 1 shows an embodiment of a conventional self-checking circuit installed at one of multiple monitoring points on a microwave main signal path. The conventional self-checking circuit comprises: a directional coupler 7 for separating and extracting a portion of a microwave signal passing through the microwave main signal path; a detector 1 for converting the portion of the microwave signal separated and extracted by the directional coupler 7 into a low frequency signal using an envelop detection method; an amplifier 2 for amplifying a signal, which is detected by the detector 1 and has weak electric power, to produce a signal having a predetermined electric power level; a comparing unit 3 for comparing the electric power of a signal amplified by the amplifier 2 with a predetermined value and producing a result value of the comparison; an interface 5 for receiving the result signal from the comparing unit 3 and identifying a location of a checked component; and a display 4 for visibly displaying a signal outputted by the interface 5.

With reference to FIGS. 1 and 2, operation of the conventional circuit having such configuration explained above will now be described in detail.

FIG. 2 shows a detailed configuration of a detecting unit 10 according to the prior art.

The directional coupler 7 is connected to a monitoring point to be checked on the microwave main signal path, and an output signal of the directional coupler 7 is applied to the detection unit 10 consisting of the detector 1, amplifier 2, and comparing unit 3.

In this case, a portion of the microwave signal passing through the monitoring point to be checked on the microwave main signal path is separated and extracted by the directional coupler 7.

The extracted portion of the microwave signal received from the directional coupler 7 is detected through the envelop detection method by the detector 1, thus removing a high frequency portion from the microwave signal and detecting a low frequency signal.

The low frequency signal outputted from the detector 1 has very weak electric power. The amplifier 2 amplifies a level of the low frequency signal up to a predetermined power level and applies a result signal of the amplifier 2 to the comparing unit 3.

The comparing unit 3 compares the level of the signal, which becomes to have sufficient electric power through the amplifier 2, with a reference value which has previously been set therein and applies a result value of the comparing unit 3 to the interface 5 in a processing unit 20.

The interface 5 transmits the result value from the comparing unit 3 to the display 4. The display 4 displays normality or abnormality based upon the result value.

With reference to FIG. 2, the comparing unit 3 which determines normality/abnormality of the monitoring point will now be described in detail.

The comparing unit 3 comprises a comparator 8 and a variable resistor 6.

The variable resistor 6 coupled to one terminal of the comparator 8 is grounded and sets the reference value, or a threshold level. Consequently, a signal which has been amplified by the amplifier 2 and then applied to the other terminal of the comparator 8 is recognized as a signal of higher or lower level than the threshold level set by the variable resistor 6.

However, such electric power measuring circuit of the conventional microwave equipment just outputs "GOOD" or "FAIL" as a result of comparing the electric power of a detected signal from the amplifier 2 with a predetermined value. Change in inner temperature of the microwave equipment results in a change in an output value of the detector since the detector is very sensitive to the temperature. Consequently, abnormality may be displayed even though, actually, the equipment operates in normal.

In this regard, the conventional self-checking circuit of the microwave equipment can detects an error only when a component concerned in the microwave equipment is completely out of order instead of previously detecting and predicting deterioration of the performance of the overall system caused by deterioration of the performance of each component. This makes it difficult to repair or replace a component which may be a major cause that a lifetime of the overall microwave equipment is reduced.

On the other hand, there is a problem in that a good component without malfunction may be replaced.

In addition, since this conventional circuit just determines "GOOD" or "FAIL", a special microwave electric power measuring equipment is required when the system is checked, maintained and repaired to prevent the deterioration of the performance of the system.

SUMMARY OF THE INVENTION

Accordingly, the present invention is directed to a self-checking circuit in a microwave equipment that substantially obviates one or more of the limitations and disadvantages of the related art.

An object of the present invention is to provide a self-checking circuit which can be fixedly installed within a microwave equipment, for easily measuring electric power of a microwave signal passing through a microwave main signal path at any time without a separate microwave electric power measuring equipment, accurately measuring actual electric power of a relevant microwave equipment by compensating for characteristics of a detector changing according to a temperature, and displaying degree of the electric power of the microwave signal concerned, allowing close observance in the microwave equipment, thereby making it easy to check, maintain, and repair the system.

Additional features and advantages of the invention will be set forth in the description which follows, and in part will be apparent from the description, or may be learned by practice of the invention. The objectives and other advantages of the invention will be realized and attained by the structure as illustrated in the written description and claims thereof, as well as the appended drawings.

To achieve these and other advantages, and in accordance with the purpose of the present invention as embodied and broadly described, the self-checking circuit in a microwave equipment includes: directional couplers installed at each monitoring point on a microwave main signal path, each, for separating and extracting a portion of a microwave signal; detectors each for converting the separated and extracted portion of the microwave signal into a low frequency signal using an envelop detection method; temperature measuring units each for measuring temperature of the microwave equipment and applying a result signal of measurement to an interface; amplifying units each for amplifying a signal, which is detected by the detector and has weak electric power, to produce a signal of a predetermined electric power level; analog/digital converting units each for converting an analog signal amplified by the amplifying unit into a digital signal; an interface for adding a unique number of a relevant monitoring point to both the signal from the temperature measuring unit and the signal outputted from the analog/digital converting unit and interfacing with an outer processing unit; a RAM which is a first storage device for storing signal values transmitted through the interface; a FOM which is a second storage device for storing temperature characteristics and electrical characteristics of each detector, gains of each amplifying unit, values of change of each signal, correlation between multiple monitoring points in their locations, priority and weight of importance of each monitoring point, and data and a program which a central processing circuit operates according to; a central processing circuit for searching various necessary data in the ROM based upon the values of the signals stored in the RAM and runs a control program, thus generating display control signals according to a result of execution of the program; and a display for displaying operational status of the system according to the display control signals received from the central processing circuit.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF PREFERRED EMBODIMENT

Figure 1:
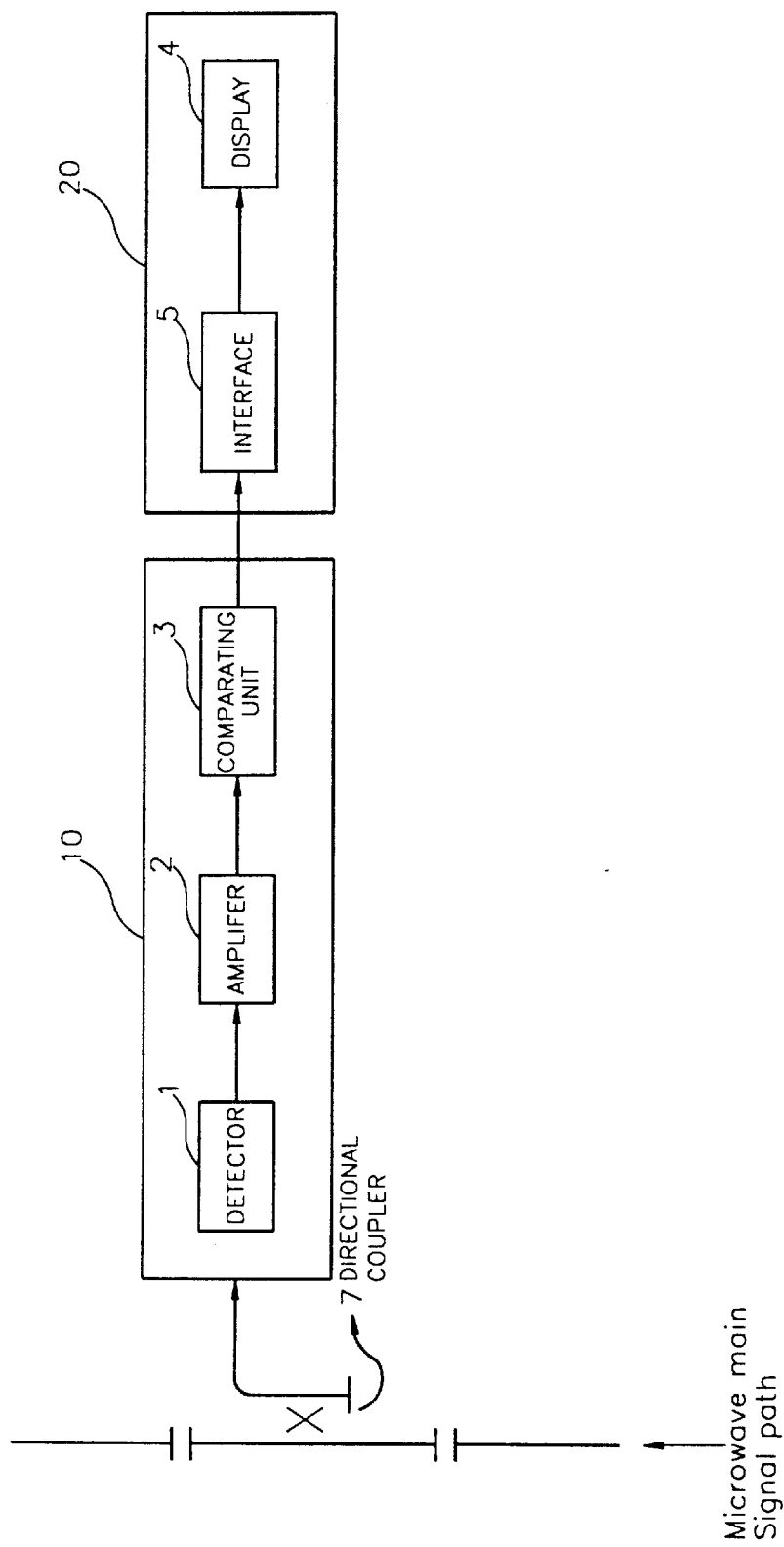
FIG. 1 is a block diagram of an electric power measuring apparatus of microwave equipment according to a prior art.
Figure 2:
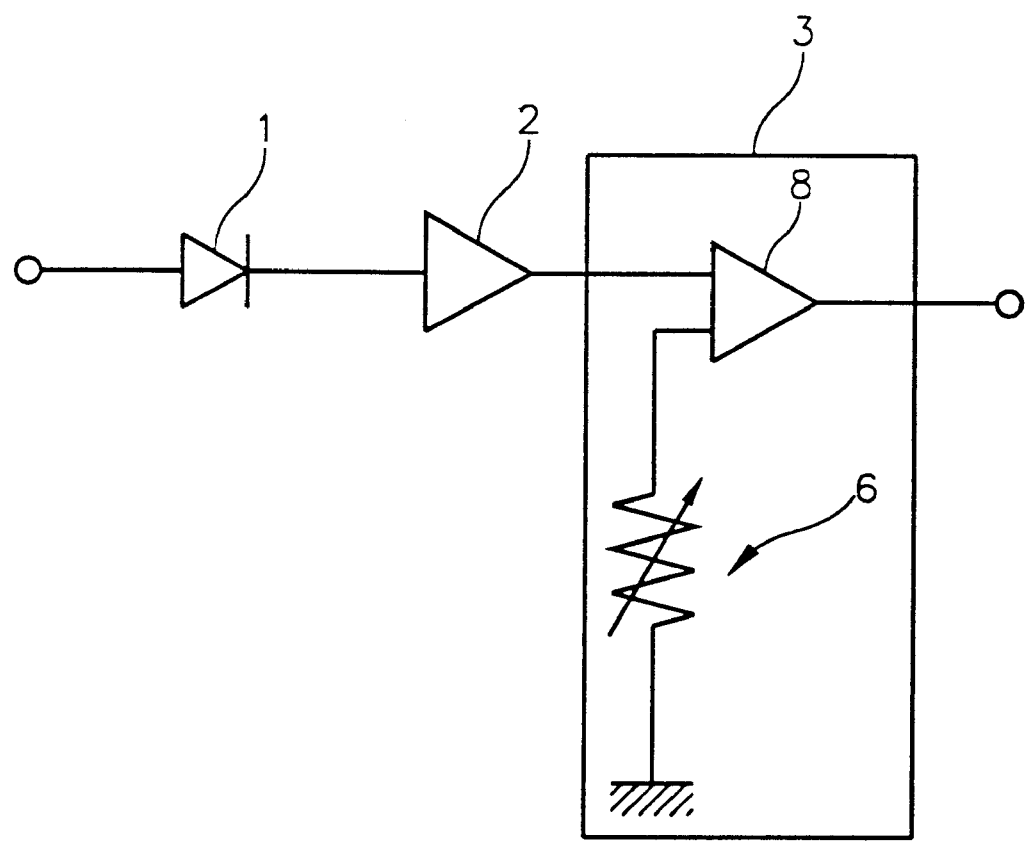
FIG. 2 shows a detailed configuration of a detecting unit according to a prior art.

Reference will now be made in detail to the preferred embodiments of the present invention, examples of which are illustrated in the accompanying drawings.

With reference to the accompanying drawings, the present invention will now be described in detail.

The self-checking circuit in a microwave equipment according to the present invention comprises: a directional coupler 109 installed at each monitoring point on a microwave main signal path, for separating and extracting a portion of a microwave signal; a detector 101 for converting the separated and extracted portion of the microwave signal into a low frequency signal using an envelop detection method; a temperature measuring unit 110 for measuring temperature of the microwave equipment and applying a result signal of measurement to an interface 104; an amplifying unit 102 for amplifying a signal, which is detected by the detector 101 and has weak electric power, to produce a signal of a predetermined electric power level; an analog/digital converting unit 103 for converting an analog signal amplified by the amplifying unit 102 into a digital signal; an interface 104 for adding a unique number of a relevant monitoring point to both the signal from the temperature measuring unit 110 and the signal outputted from the analog/digital converting unit 103 and interfacing with an outer processing unit 120; and the processing unit 120 for processing and displaying the digital signals transmitted from the interface 104.

The temperature measuring unit 110 includes a temperature sensor 111, an amplifier 112, and an analog/digital converter 114. The temperature measuring unit 110 measures the ambient temperature of a monitoring point concerned, converts a result signal of the measurement into a digital signal, and applies the digital signal to the interface 104.

The processing unit 120 comprises a ROM 106, a central processing circuit 107, a RAM 105, and a display 108. This processing unit 120 is installed within the microwave equipment and has a function of processing and displaying digitalized data and unique identifications generated from each monitoring point.

The RAM 105, which is a first storage device, stores each digital signal into which a low frequency signal separated and extracted from a microwave signal at each monitoring point is converted and each measured value of temperature, these digital signal and measured temperature value are transmitted from the interface 104.

The ROM 106, which is a second storage device, stores temperature characteristics and electrical characteristics of each monitoring point and detector 101, gains of each amplifying unit 102, highest and lowest limitations of electric power of each monitoring point, correlation between multiple monitoring points in their locations, priority and weight of importance of each monitoring point, and data and a program which the central processing circuit 107 operates according to.

The central processing circuit 107 searches various necessary data in the ROM 106 based upon the values of the signals stored in the RAM 105 and runs a control program, thus analyzing characteristics of microwave signals at each monitoring point and generating operation control signals according to results of the analysis.

The display 108 visibly displays operation status of the system according to display control signals received from the central processing circuit 107.

Figure 3:
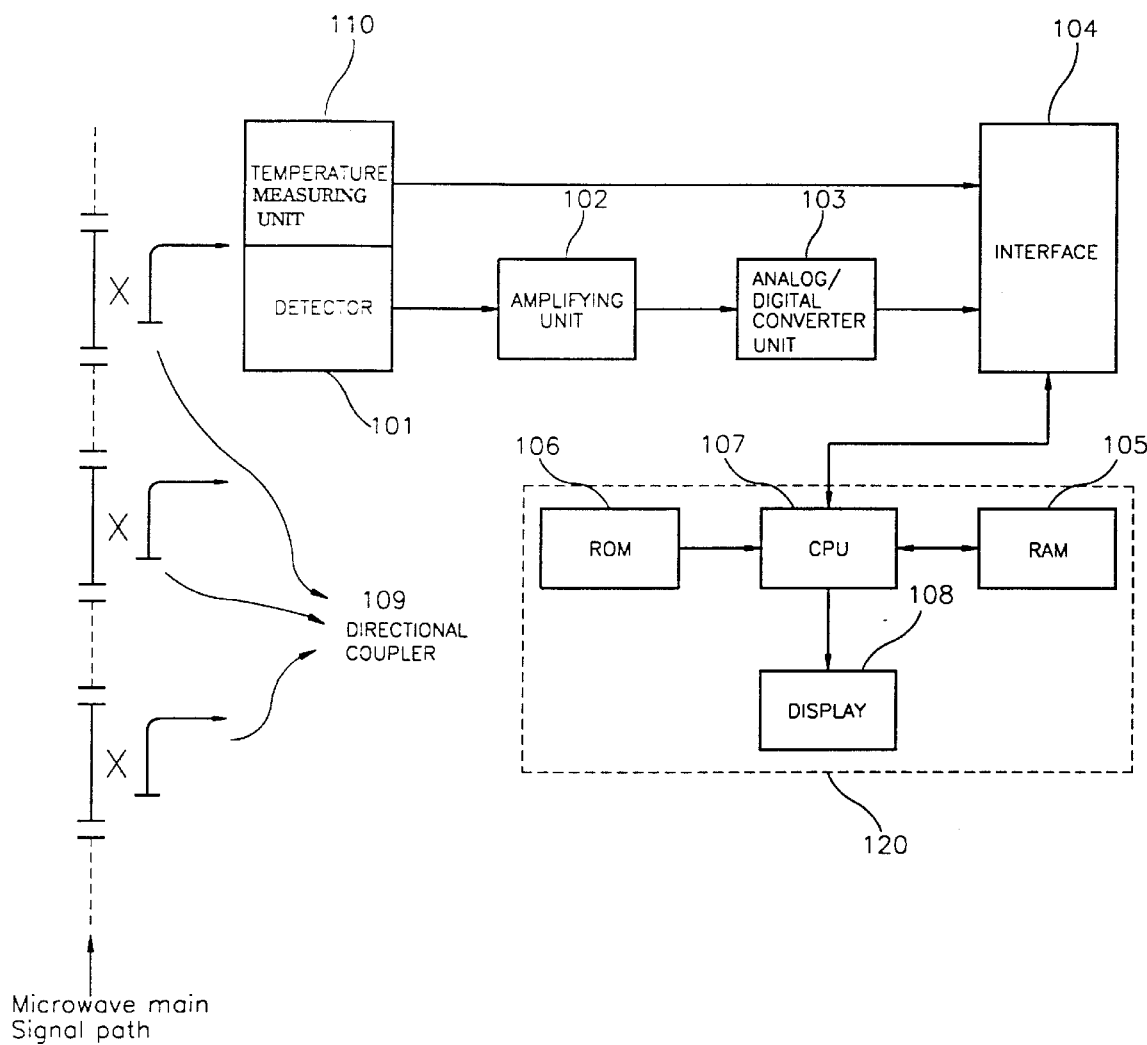
FIG. 3 shows a block diagram of a self-checking circuit in a microwave equipment according to the present invention.
Figure 4:
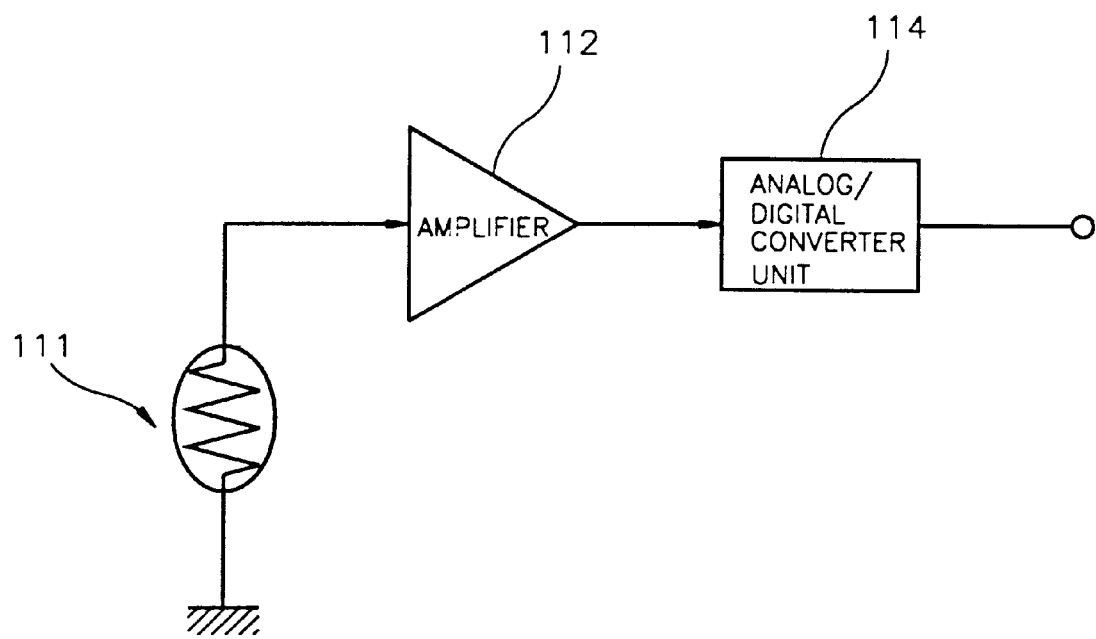
FIG. 4 shows a detailed configuration of a temperature measuring unit according to the present invention.

Operation and effect of the present invention will now be described in detail with reference to FIGS. 3 and 4.

Each directional coupler 109 is connected to each monitoring point on a microwave main signal path. The directional coupler 109 separates and extracts a portion of a microwave signal.

The detector 101 converts the extracted signal into a low frequency signal using the envelop detection method.

In the temperature measuring unit 110, the temperature sensor 111 detects ambient temperature by electrically of the detector 101, the amplifier 112 amplifies the electrically detected level of the temperature, and the analog/digital converter 114 converts the amplified analog signal into a digital signal. The digital data on the ambient temperature of the detector 101 is applied to the interface 104.

The low frequency signal detected at the detector 101 has an electric power level which is too weak to be use. The amplifying unit 102 amplifies the low frequency signal to make a signal of a predetermined electric power level, before applying it to the analog/digital converting unit 103.

The analog/digital converting unit 103 converts the low frequency signal amplified by the amplifying unit 102 into a corresponding digital signal and applies it to the interface 104.

The interface 104 adds a unique identification number of the relevant monitoring point to both the signal from the temperature measuring unit 110 and the signal from the analog/digital converting unit 103, before applying them to the central processing circuit 107 in the processing unit 120.

The central processing circuit 107 searches the necessary control program and various data in the ROM 106 and analyzes the characteristics of the microwave signal of the relevant monitoring point based upon the values of signals extracted at each monitoring point and each ambient temperature detection signal value transmitted via each interface 104 to and stored in the RAM 105, and then compensates for a change in an output of the detector 101 of which the operational characteristic changes according to its ambient temperature.

As a result of the compensation, a display control signal is generated and operational status of the system is displayed through the display 108.

A control program necessary for the displaying operation is also stored in the ROM 106.

The program allows to show change of each monitoring point to be checked through the display or to generate or display an alarm for malfunction when the change exceeds limits which have been previously set for smooth operation of the microwave equipment.

In other words, the central processing circuit 107 performs the function of the conventional comparing unit 3 and compensates for characteristics of each detector 101 of which the output changes according to the temperature, thereby making it possible to measure a real value of a signal level of the microwave main signal path and display a signal level detected from a relevant monitoring point in linear instead of displaying it as "GOOD" or "FAIL" in binary.

Accordingly, the present invention accurately determines whether the microwave equipment operates normally or abnormally and previously recognizes the deterioration of the performance or malfunction, thus making it easy to check, maintain, and repair the system to establish optimum performance in the system.

Additionally, since the present invention displays the detected signal level linearly, a special microwave electric power measuring equipment is not needed.

Such measuring method using the present invention comprises the steps of: separating and extracting a portion of a microwave signal at a monitoring point on a microwave main signal path using the directional coupler 109; detecting the extracted signal using the detector 101; measuring ambient temperature of the detector 101 using the temperature measuring unit 110; converting an output signal of the amplifying unit 102 into digital data using the analog/digital converting unit 103; performing interface with an outside with respect to the signal from the temperature measuring unit 110 and the signal from the analog/digital converting unit 103 using the interface 104; storing signal values transmitted through the interface 104 in the first storage device 105; storing a control program and various data necessary for checking the microwave equipment in the second storage device 106; comparing and analyzing the signals stored in the first storage device 105 using the control program and data stored in the second storage device 106 and producing a result value of the comparison and analysis using the central processing circuit 107; and displaying the result value outputted from the central processing circuit 107 using the display 108.

Figure 5:
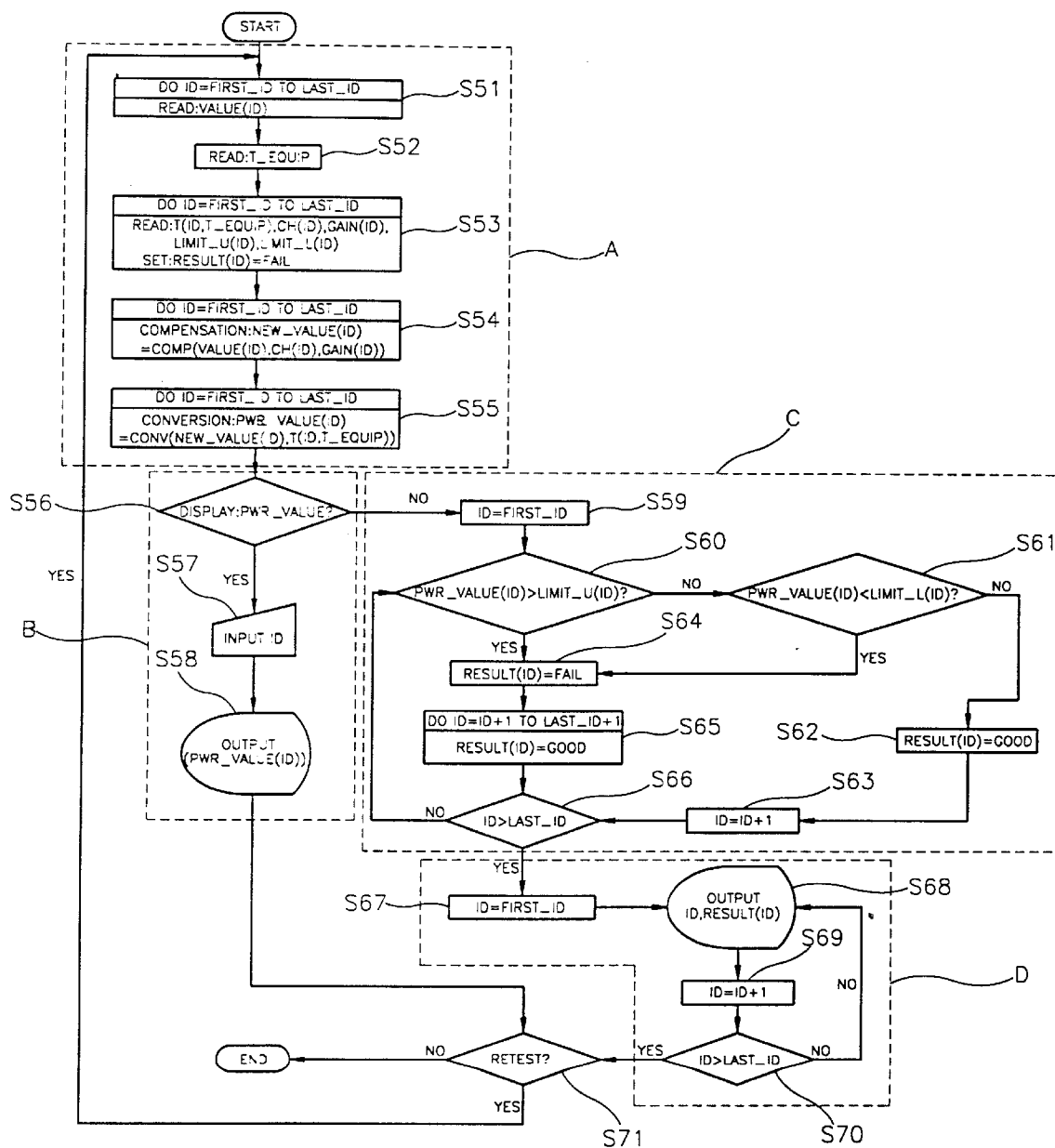
FIG. 5 is a flow chart showing how electric power of a microwave equipment is measured according to the present invention.

The method will now be described in detail much more with reference to FIG. 5.

Measured electric power values and temperatures at every monitoring point from the first one to the last one are read from the first storage device, RAM 105, based upon unique identifications of each monitoring point (S51 and S52).

The temperature characteristics and electrical characteristics of each detector 101 at each monitoring point, gains of each amplifying unit 102, and the highest and lowest limit values of the set electric power at each monitoring point are read and a testing result with respect to electric power values measured at each monitoring point is previously set to "FAIL" (S53)

Each electric power value at each monitoring point is compensated for a temperature characteristic and electrical characteristic of a relevant detector 101 and for a gain of a relevant amplifying unit 102. Therefore, the measured electric power values at every monitoring point are adjusted to compensated new values (S54).

Each compensated new value is compensated for the corresponding temperature value read at the step S52 (S55).

Through compensation for the ambient temperature of the equipment, temperature characteristic and electrical characteristic of the detector 101, and gain of the amplifying unit 102, the measured electric power value at the relevant monitoring point is replaced with a real value which is actually desired to be measured.

Whether or not to display the compensated electric power values of each monitoring point is determined (S56).

If it is decided to display the value, a corresponding unique identification (ID) of the relevant monitoring point is inputted (S57) and the compensated real electric power value of the corresponding monitoring point is outputted to a monitor or a printer with its unique ID in linear (s58).

If it is determined that the electric power value is not displayed at the step S56, an ID of a monitoring point is set to the unique ID number of the first monitoring point (S59)

Whether or not the electric power value corresponding to the unique ID exceeds the highest limit value is determined (S60). If the electric power value does not exceed the highest limit value, whether or not the electric power value is less than the lowest limit value is determined (S61). If the electric power value is not less than the lowest limit value, a test result is established as "GOOD" (S62), and 1 is added to the unique ID number of the monitoring point (S63).

If the electric power value exceeds the highest limit value at the step S60 or is less than the lowest limit value at the step S61, the test result is established as "FAIL" (S64). 1 is added to the unique ID of the monitoring point which is under the test in present and test results with respect to all the monitoring points hereafter are set to "GOOD" (S65).

If the ID of a monitoring point established at the step S65 is less than the last ID number, the procedure goes back: to the step S60 (S66). Otherwise, the ID of a monitoring point is set to the unique ID number of the first monitoring point (S67). The unique ID, weight of importance, test result, and electric power value of the corresponding monitoring point are outputted to the monitor or printer (S68).

1 is added to the unique ID (S69), and whether or not the ID corresponds to that of the last monitoring point (S70).

If the ID is not the last one, the procedure goes back to the step S68. If the ID number exceeds the last one, whether or not to perform a retest is determined (S71).

If the test is determined not to be performed any more, the procedure ends. To continue the test, the procedure goes back to the step S51.

In the microwave equipment which has a single signal path and where each component on the path is established as a monitoring point, the present invention measures electric power values of each monitoring point and determines the correlation between multiple monitoring points in their locations and priority and weight of importance of each monitoring point using a program, thereby easily finding a component causing the deterioration of the performance or malfunction in the microwave equipment.

In case where there are multiple microwave equipments and they are distant from each other, the interface 104 may be made having a function of remote data communication and the central processing circuit 107, ROM 106, and RAM 105 in the processing unit 120 may be replaced with a personal computer or the like equipment having performance above that of the personal computer. In addition, the substitute equipment such as the personal computer may be fixedly coupled to one of the self-checking circuits of the multiple microwave equipments. Consequently, the interface 104 can be used as a remote measuring circuit by making it have the remote data communication function.

When an equipment uses a signal of a microwave frequency band, any embodiment of the present invention can be applied to the equipment.

Accordingly, the present invention easily measures an electric power of a microwave signal which is compensated for the temperature characteristic of a monitoring point at any time and easily finds a component causing deterioration of the performance and malfunction of the system through an internally installed microwave electric power measuring apparatus, thereby facilitating check, maintenance, and repair of the microwave equipment.

Additionally, since the present invention shows the electric power level of the microwave signal in detail through the display, allowing direct judgement on the status of the performance of the microwave equipment, and compensates for the change of temperature, allowing accurate measurement of a real value of a signal level.

It will be apparent to those skilled in the art that various modifications and variations can be made in a self-checking circuit in a microwave equipment of the present invention without deviating from the spirit or scope of the invention. Thus, it is intended that the present invention cover the modifications and variations of this invention provided they come within the scope of the appended claims and their equivalents.

What is claimed is:

1. A self-checking circuit in a microwave equipment, comprising:

directional couplers each for separating and extracting a portion of a microwave signal from each monitoring point on a microwave main signal path;

detectors each for detecting an extracted signal from said directional coupler;

multiple temperature measuring means each for measuring temperature of said detector;

multiple amplifying means each for amplifying a detected signal from said detector;

multiple analog/digital converting means each for converting an output signal of said amplifying means into digital data;

an interface for performing interface with an outside with respect to the signal of said temperature measuring means and the digital data of said analog/digital converting means;

first storage means for storing signal values transmitted through said interface;

second storage means for storing a control program and various data;

a central processing circuit for comparing and analyzing the signals stored in said first storage means using the control program and data stored in said second storage means and outputting a result of the comparison and analysis; and means for displaying an output signal of the central processing circuit.

2. The self-checking circuit in the microwave equipment as claimed in claim 1, wherein said detector uses an envelop detection method.

3. The self-checking circuit in the microwave equipment as claimed in claim 1, wherein said temperature measuring means each comprises a temperature sensor for measuring the temperature, an amplifier for amplifying a value of the temperature, and an analog/digital converter for converting the value amplified into digital data.

4. The self-checking circuit in the microwave equipment as claimed in claim 1, wherein said interface adds a corresponding unique identification number to signals from said temperature measuring means and signals from said monitoring points concerned.

5. The self-checking circuit in the microwave equipment as claimed in claim 1, wherein said second storage means has a program for setting limit values of data detected from each monitoring point and displaying a fact that the detected data goes beyond the limit value.

6. The self-checking circuit in the microwave equipment as claimed in claim 1, wherein said second storage means has a program for compensating data values detected at said relevant monitoring point for an electric characteristic and a gain of said relevant amplifying means.

7. The self-checking circuit in the microwave equipment as claimed in claim 1, wherein said second storage means has a program for compensating for temperature characteristics of said detectors which change according to temperature.

8. The self-checking circuit in the microwave equipment as claimed in claim 1, wherein said second storage means has a program for generating a result value of data values detected at the monitoring points from a next one of said corresponding monitoring point to a last one as "GOOD" when a data value detected at a corresponding monitoring point is not in a range of limit values.

9. The self-checking circuit in the microwave equipment as claimed in claim 1, wherein said second storage means has a program for detecting a data value at a particular monitoring point.

10. Self-checking circuits in multiple microwave equipments comprising:

directional couplers each for separating and extracting a portion of a microwave signal from each monitoring point on a microwave main signal path of multiple microwave equipments;

detectors each for detecting an extracted signal from said directional coupler;

multiple temperature measuring means each for measuring temperature of said detector;

multiple amplifying means each for amplifying a detection signal from said detector;

multiple analog/digital converting means each for converting an output signal of said amplifying means into digital data;

interfaces each for performing interface with an outside with respect to the signal of said temperature measuring means and the digital data of said analog/digital converting means;

first storage means each for storing signal values transmitted through said interface;

second storage means each for storing a control program and various data;

central processing circuits each for comparing and analyzing the signals stored in said first storage means using the control program and data stored in said second storage means and outputting a result of the comparison and analysis; and meas each for displaying a result value outputted from the central processing circuit.

11. The self-checking circuits in the microwave equipments as claimed in claim 10, wherein said interface transmits said digital data to said central processing circuit using a function of remote data communication.

12. A self-checking method in a microwave equipment comprising the steps of:

separating and extracting a portion of a microwave signal at each monitoring point on a microwave main signal path using each corresponding directional coupler;

detecting the extracted portion of the signal using each detector;

amplifying the signal detected by said each detector using each amplifier;

measuring ambient temperature of said each detector using each temperature measuring means;

converting an output signal of each amplifying means into digital data using an analog/digital converting unit;

performing interface with an outside with respect to a signal from the temperature measuring means and a signal from the analog/digital converting means using an interface;

storing signal values transmitted through said interface in first storage means;

storing a control program and various data necessary for checking the microwave equipment in second storage means;

comparing and analyzing the signals stored in said first storage means using the control program and data stored in said second storage means and producing a result value of the comparison and analysis using a central processing circuit; and displaying the result value outputted from said central processing circuit.

13. The self-checking method in the microwave equipment as claimed in claim 12, wherein the step of comparing and analyzing the signals stored in said first storage means using the control program and data stored in said second storage means and producing the result value of the comparison and analysis using said central processing circuit comprises the steps of:

reading data values measured at every monitoring point from the first one to the last one which are stored in said first storage means;

reading temperature values measured at every monitoring point from the first one to the last one which are stored in said first storage means;

reading temperature characteristics and electrical characteristics of said each detector at said each monitoring point, gains of said each amplifying means, and limit values of data from said second storage means;

compensating each data value of said each monitoring point stored in said first storage means for each corresponding electrical characteristic and temperature characteristic of said each detector and each corresponding gain of said each amplifying means;

compensating each compensated value for the temperature values measured at each monitoring point;

generating a result value as "FAIL" when a data value of a corresponding monitoring point is out of a range of limit values; and generating the result value as "FAIL" when the data value of the corresponding monitoring point does not exceed the limit values.

14. The self-checking method in the microwave equipment as claimed in claim 12, wherein the step of comparing and analyzing the signals stored in the first storage means using the control program and data stored in the second storage means and producing the result value of the comparison and analysis using said central processing circuit comprises the step of setting all initial result values of each monitoring point to "FAIL".

15. The self-checking method in the microwave equipment as claimed in claim 12, wherein the step of comparing and analyzing the signals stored in said first storage means using the control program and data stored in said second storage means and producing the result value of the comparison and analysis using said central processing circuit comprises the step of selectively outputting a data value of a particular monitoring point.

16. The self-checking method in the microwave equipment as claimed in claim 12, wherein the step of displaying the result value outputted from said central processing circuit using said display includes the step of feeding back to sequentially output result values of every monitoring point following said first monitoring point after outputting a result value of said first monitoring point.

17. The self-checking method in the microwave equipment as claimed in claim 13, wherein the step of generating the result value as "FAIL" when the data value of the corresponding monitoring point is out of the range of the limit values includes the step of displaying result values of data values of the monitoring points from a next one of said corresponding monitoring point to the last one as "GOOD".

18. The self-checking method in the microwave equipment as claimed in claim 13, wherein the step of generating the result value as "FAIL" when the data value of the corresponding monitoring point is out of the range of the limit values includes the step of feeding back to sequentially compare data values of every monitoring point following said first monitoring point after comparing a data value of said first monitoring point.

19. The self-checking method in the microwave equipment as claimed in claim 13, wherein the step of generating the result value as "GOOD" when the data value of the corresponding monitoring point does not exceed the limit values includes the step of feeding back to sequentially compare data values of every monitoring point following said first monitoring point after comparing a data value of said first monitoring point.

\* \* \* \* \*